(12) United States Patent
Qian et al.

(10) Patent No.: US 8,476,728 B2
(45) Date of Patent: Jul. 2, 2013

(54) PARASITIC PIN DEVICE IN A BICMOS PROCESS AND MANUFACTURING METHOD OF THE SAME

(75) Inventors: Wensheng Qian, Shanghai (CN); Ju Hu, Shanghai (CN)

(73) Assignee: Shanghai Hua Hong NEC Electronics Co., Ltd., Shanghai (CN)

( * ) Notice: Subject to any disclaimer, the term of this patent is extended or adjusted under 35 U.S.C. 154(b) by 0 days.

(21) Appl. No.: 13/218,316

(22) Filed: Aug. 25, 2011

(65) Prior Publication Data

US 2012/0049319 A1    Mar. 1, 2012

(30) Foreign Application Priority Data

Aug. 26, 2010   (CN) .......................... 2010 1 0265357

(51) Int. Cl.
*H01L 31/102*       (2006.01)
*H01L 29/66*        (2006.01)
(52) U.S. Cl.
USPC .......................................... 257/458; 257/656
(58) Field of Classification Search
None
See application file for complete search history.

(56) References Cited

U.S. PATENT DOCUMENTS

| | | | | |
|---|---|---|---|---|
| 6,015,726 | A * | 1/2000 | Yoshida | 438/202 |
| 6,426,547 | B1 * | 7/2002 | Greenberg et al. | 257/656 |
| 2001/0031521 | A1 * | 10/2001 | Pan et al. | 438/197 |
| 2002/0160562 | A1 * | 10/2002 | Babcock et al. | 438/207 |
| 2007/0298579 | A1 * | 12/2007 | Hu et al. | 438/377 |

* cited by examiner

*Primary Examiner* — Julio J Maldonado
*Assistant Examiner* — Moin Rahman
(74) *Attorney, Agent, or Firm* — Blakely Sokoloff Taylor & Zafman

(57) ABSTRACT

A parasitic PIN device in a BiCMOS process is disclosed. The device is formed on a silicon substrate, in which an active region is isolated by shallow trenches. The device includes: an N-type region, consisting of N-type pseudo buried layers respectively formed at the bottom of shallow trench isolation oxide layers and extending into the active region; an I-type region, consisting of an N-type collector implantation region formed in the active region and contacting with the N-type region; a P-type region, consisting of a P-doped intrinsic base epitaxial layer on a surface of the active region and contacting with the I-type region. The device of the present invention has a low insertion loss and a high isolation. A manufacturing method of parasitic PIN device in compatible with existing BiCMOS process is also disclosed.

10 Claims, 2 Drawing Sheets

PARASITIC PIN DEVICE IN A BICMOS PROCESS AND MANUFACTURING METHOD OF THE SAME

CROSS-REFERENCES TO RELATED APPLICATIONS

This application claims the priority of Chinese patent application number 201010265357.4, filed on Aug. 26, 2010, the entire contents of which are incorporated herein by reference.

TECHNICAL FIELD

The present invention is generally in the field of fabrication of semiconductor integrated circuits, and more specifically, relates to a parasitic PIN device a BiCMOS process and its manufacturing method.

BACKGROUND OF THE INVENTION

A conventional bipolar transistor in a BiCMOS process adopts heavily doped collector region buried layers to reduce the collector region resistance. The collector region buried layers are connected by N-type implantation with high concentration and high energy so as to form a collector pick-up. Medium to lightly doped collector regions are formed on the collector region buried layers by epitaxy. A base region is formed by in-situ P-doped epitaxy, and an emitter region is formed by N-type heavily-doped polysilicon. Thereby, a bipolar transistor is fabricated.

SUMMARY OF THE INVENTION

An objective of the present invention is to provide a parasitic PIN device in a BiCMOS process. The parasitic PIN device has a low insertion loss and a high isolation.

Another objective of the present invention is to provide a manufacturing method parasitic PIN device in a BiCMOS process, which can be implemented by using existing BiCMOS process conditions without introducing additional process conditions, and can also reduce the manufacturing costs.

To achieve the aforementioned objective, the parasitic PIN device in a BiCMOS process according to the present invention is formed on a P-type silicon substrate, and an active region is isolated by shallow trench isolation oxide layers. The parasitic PIN device includes: an N-type region, consisting of N-type pseudo buried layers formed at the bottom of the shallow trench isolation oxide layers and extending laterally into the active region, wherein the N-type region is picked up by forming contact holes in the shallow trench isolation oxide layers and tilling the contact holes with metal; an I-type region, consisting of an N-type collector implantation region formed in the active region, contacting with the N-type region extending into the active region; a P-type region, consisting of an intrinsic base epitaxial layer doped with P-type impurities on the active region, and contacting with the I-type region, wherein the P-type region is picked up by a metal contact formed thereon.

According to a preferred embodiment, the N-type pseudo buried layers are formed by ion implantation at the bottom of the shallow trench isolation oxide layers. The impurity concentration of the N-type pseudo buried layers is in a range of 1 e19 $cm^{-3}$~1 e21 $cm^{-3}$, the ion implantation dose is 1 e14 $cm^{-2}$~1 e16 $cm^{-2}$, the implantation energy is less than 30 Kev, and the impurities implanted can be phosphor or arsenic or antimony. The intrinsic base epitaxial layer of the P-type region is a P-doped silicon epitaxial layer or a P-doped Silicon-Germanium epitaxial layer, or a P-doped Carbon-Silicon-Germanium epitaxial layer, which is formed by in-situ P-doping and extrinsic base region ion implantation. The impurity concentration of the P-doping is in a range of 1 e19 $cm^{-3}$~1 e21 $cm^{-3}$; the impurities adopted in the extrinsic base region ion implantation can be boron or boron fluoride, wherein the implantation dose is 1 e14 $cm^{-2}$~1 e15 $cm^{-2}$, and the implantation energy is 2 KeV~30 KeV. The impurities implanted in the collector implantation region of the I-type region are phosphor or arsenic, wherein the implantation dose is 1 e12 $cm^{-2}$~5 e13 $cm^{-2}$ and the implantation energy is 100 KeV~2000 KeV.

According to a preferred embodiment, the N-type region on both sides of the active region can extend into the active region and contact with each other by controlling the width of the active region.

To achieve the aforementioned objective, the manufacturing method of parasitic PIN device in a BiCMOS process according to the present invention includes the following steps:

Step 1: form shallow trenches in a P-type silicon substrate by shallow trench etch process, and isolate the active region by the shallow trenches.

Step 2: form an N-type region by N-type pseudo buried layer ion implantation at the bottom of the shallow trenches. The implantation dose of the N-type pseudo buried layer ion implantation is 1 e14 $cm^{-2}$~1 e16 $cm^{-2}$, the implantation energy is less than 30 Kev, and the impurities implanted can be phosphor or arsenic or antimony.

Step 3: form shallow trench isolation oxide layers by filling silicon oxide into the shallow trenches.

Step 4: form an I-type region by N-type collector region implantation in the active region. The impurities implanted in the collector region can be phosphor or arsenic, wherein the implantation dose is 1 e12 $cm^{-2}$~5 e13 $cm^{-2}$, and the implantation energy is 100 KeV~2000 KeV.

Step 5: conduct thermal annealing to the silicon substrate. The N-type region will extend vertically and laterally into the active region and contact with the I-type region during the thermal annealing process. By controlling the width of the active region, the N-type region on both sides of the active region can extend into the active region and contact with each other during the thermal annealing process.

Step 6: form an intrinsic base epitaxial layer on the surface of the active region, and form a P-type region by P-type extrinsic base region ion implantation into the intrinsic base epitaxial layer. The P-type region is in contact with the I-type region. The intrinsic base epitaxial layer can be an in-situ P-doped silicon epitaxial layer or Silicon-Germanium epitaxial layer or carbon-Silicon-Germanium epitaxial layer. The impurities adopted in the extrinsic base region ion implantation can be boron or boron fluoride, wherein the implantation dose is 1 e14 $cm^{-2}$~1 e15 $cm^{-2}$, and the implantation energy is 2 KeV~30 KeV.

Step 7: form deep-hole contacts in the shallow trench isolation oxide layers on the N-type region to pick up the N-type region, and pick up the P-type region by forming a metal contact on the P-type region.

The parasitic PIN device in a BiCMOS process in the present invention has a low insertion loss of less than 2 dB and a high isolation of more than 30 dB, which provides an alternative device choice for circuits without introducing additional process conditions, and can be widely applied in microwave-controlled circuits such as microwave switching, microwave modulating, amplitude limiting and digital phase shifting, and can also be used in the fields of radio frequency switch, low-frequency rectifier, and so on. The manufacturing method of the present invention can be implemented by using existing process conditions in a BiCMOS process, such as pseudo buried layer ion implantation, collector implantation, intrinsic base epitaxial growth, extrinsic base region ion implantation and so on. There is no need to introduce additional process conditions, thus reducing the manufacturing costs.

BRIEF DESCRIPTION OF THE DRAWINGS

The present invention is further detailed in combination with the drawings and embodiments below.

DETAILED DESCRIPTION OF THE INVENTION

Figure 1:
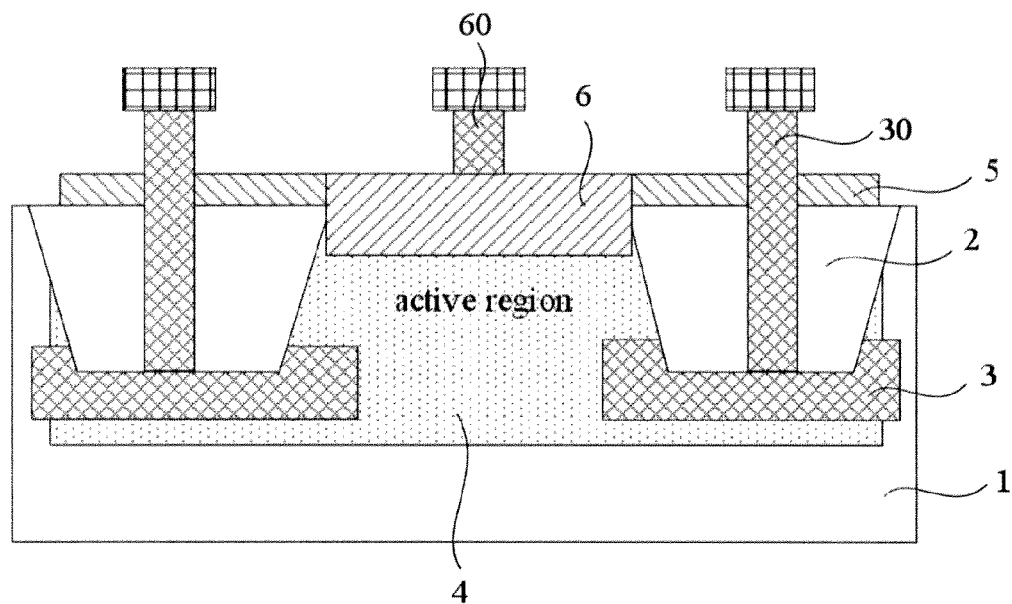
FIG. 1 is a structural diagram of the parasitic PIN device in a BiCMOS process according to one embodiment of the present invention.

Please refer to FIG. 1, which is a structural diagram of the parasitic PIN device in a BiCMOS process according to one embodiment of the present invention. The parasitic PIN device is formed on a P-type silicon substrate 1. An active region is isolated by shallow trench isolation oxide layers 2. The parasitic PIN device includes:

An N-type region, consisting of N-type pseudo buried layers 3 which are respectively formed at the bottom of the shallow trench isolation oxide layers 2 and extend laterally into the active region. The N-type region is picked up by forming contact holes 30 in the shallow trench isolation oxide layers 2 and filling the contact holes 30 with metal. The N-type pseudo buried layers 3 are formed by N-type pseudo buried layer ion implantation at the bottom of the shallow trench isolation oxide layers 2, wherein the implantation dose is $1\,e14\,cm^{-2} \sim 1\,e16\,cm^{-2}$, the implantation energy is less than 30 Kev, and the impurities implanted are phosphor or arsenic or antimony.

An I-type region, consisting of an N-type collector implantation region 4 formed in the active region and contacting with the N-type pseudo buried layers 3 extending into the active region. The impurities implanted in the collector implantation region 4 are phosphor or arsenic; the implantation dose is $1\,e12\,cm^{-2} \sim 5\,e13\,cm^{-2}$, and the implantation energy is 100 KeV~2000 KeV.

A P-type region, consisting of an intrinsic base epitaxial layer 5 doped with P-type impurities formed on the surface of the active region, or in other words, consisting of an extrinsic base implantation region 6 as shown in FIG. 1 formed by extrinsic base implantation in an intrinsic base epitaxial layer 5 on the surface of the active region. The P-type region is in contact with the I-type region, and is picked up by forming a metal contact 60 on the extrinsic base implantation region 6. The impurities adopted in the extrinsic base implantation are boron or boron fluoride, wherein the implantation dose is $1\,e14\,cm^{-2} \sim 1\,e15\,cm^{-2}$, and the implantation energy is 2 KeV~30 KeV.

Figure 2A:
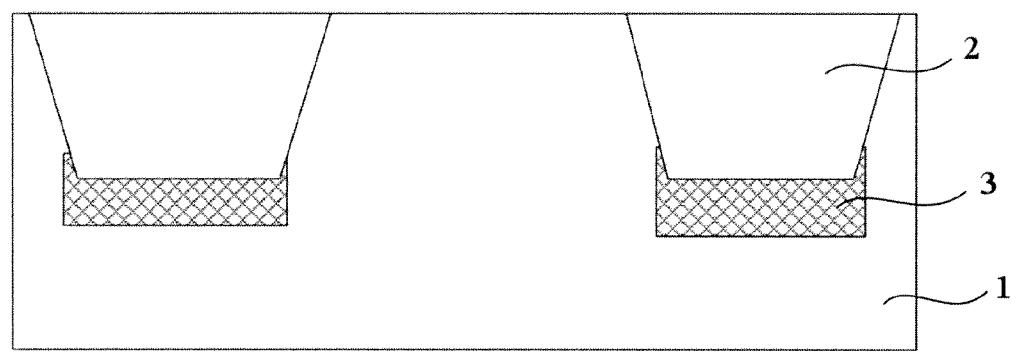
FIGS. 2A-2D are structural diagrams of the devices in steps of the manufacturing method of parasitic PIN device in a BiCMOS process according to one embodiment of the present invention.

As shown in FIGS. 2A-2D, which are structural diagrams of the device in steps of the manufacturing method of parasitic PIN device in a BiCMOS process according to one embodiment of the present invention, the manufacturing method of parasitic PIN device in a BiCMOS process according to one embodiment of the present invention includes the following steps:

Step 1: as shown in FIG. 2A, forming shallow trenches in a lightly-doped P-type silicon substrate 1 by shallow trench etch process.

Step 2: as shown in FIG. 2A, forming N-type pseudo buried layers 3 by N-type pseudo buried layer ion implantation at the bottom of the shallow trenches. The N-type pseudo buried layers 3 form an N-type region of the parasitic PIN device. The implantation dose of the pseudo buried layer ion implantation is $1\,e14\,cm^{-2} \sim 1\,e16\,cm^{-2}$, the implantation energy is less then 30 Kev, and the impurities implanted are phosphor, arsenic or antimony.

Step 3: as shown in FIG. 2A, filling silicon oxide in the shallow trenches to form shallow trench isolation oxide layers 2.

Figure 2B:
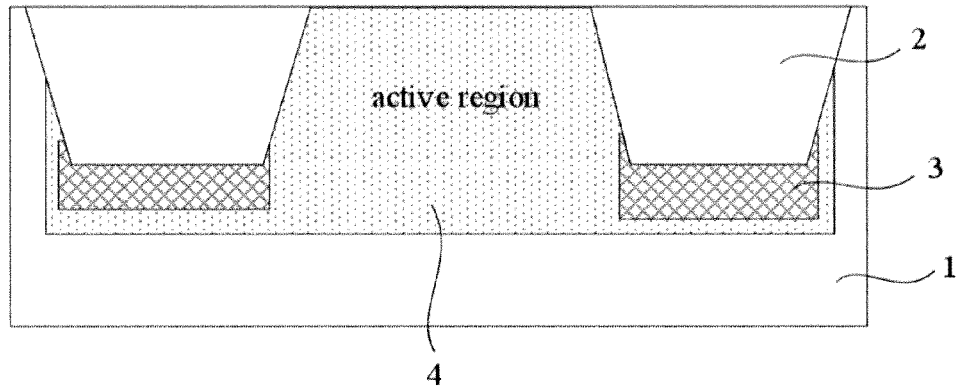

Step 4: as shown in FIG. 2B, the shallow trench isolation oxide layers 2 isolate an active region in the P-type substrate 1. Form a collector implantation region 4 in the active region by N-type collector implantation. The collector implantation region 4 forms an I-type region of the parasitic PIN device. The impurities adopted in the collector implantation are phosphor or arsenic, wherein the implantation dose is $1\,e12\,cm^{-2} \sim 5\,e13\,cm^{-2}$, and the implantation energy is 100 KeV~2000 KeV.

Step 5, as shown in FIG. 2B, conducting thermal annealing to the P-type silicon substrate 1. The collector implantation region 4 and the N-type pseudo buried layers 3 will diffuse vertically and laterally during the thermal annealing process, and the N-type pseudo buried layers 3 will extend into the active region and contact with the collector implantation region 4. By controlling the width of the active region, the N-type pseudo buried layers 3 on both sides of the active region may overlap during the thermal annealing process, that is, the N-type pseudo buried layers 3 on both sides of the active region may connect with each other, in this way, reducing the leakage current of the substrate.

Figure 2C:
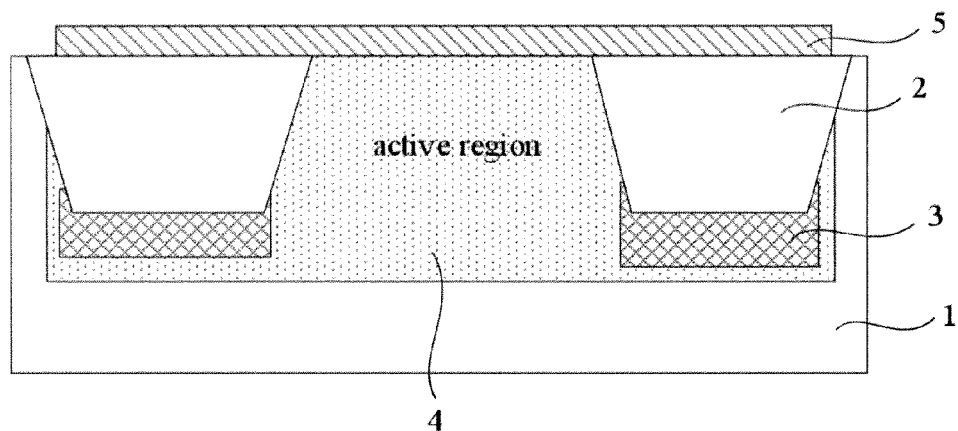
Figure 2D:
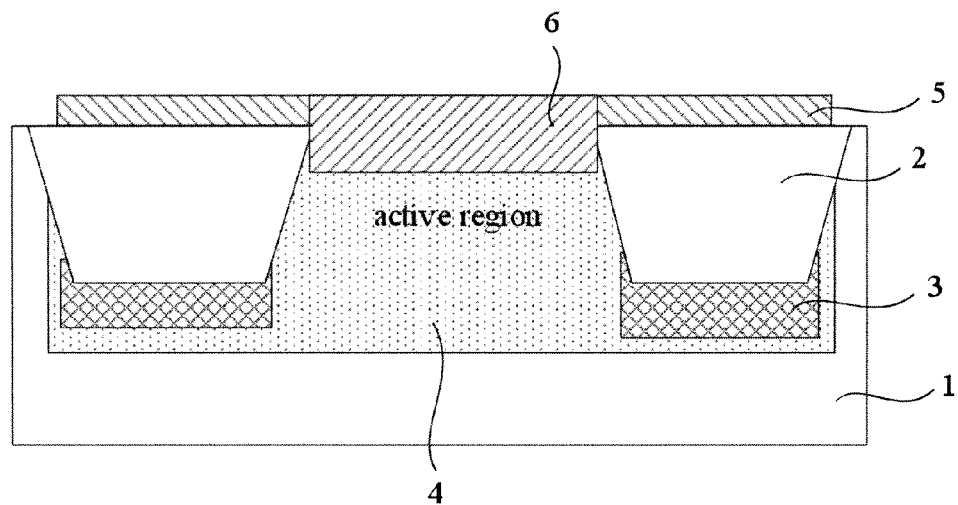

Step 6: as shown in FIG. 2C, forming an intrinsic base epitaxial layer 5 on the surface of the P-type silicon substrate 1. The intrinsic base epitaxial layer 5 can be a silicon epitaxial layer, or a Silicon-germanium epitaxial layer, or a Carbon-Silicon-germanium epitaxial layer. As shown in FIG. 2D, defining an ion implantation window on the surface of the active region, and forming an extrinsic base implantation region 6 by conducting extrinsic base implantation of bipolar transistor on the surface of the active region via this window. The extrinsic base implantation region 6 forms a P-type region of the parasitic PIN device. The impurities adopted in the extrinsic base implantation are boron or fluoride boron, wherein the implantation dose is $1\,e14\,cm^{-2} \sim 1\,e15\,cm^{-2}$, and the implantation energy is 2 KeV~30 KeV.

Step 7: as shown in FIG. 1, forming deep-hole contacts in the shallow trench isolation oxide layers 2 above the N-type region, namely the N-type pseudo buried layers 3, to pick up the N-type region. Form a metal contact 60 on the P-type region to pick up the P-type region.

The above contents have made a concrete specification of the present invention through the embodiments, but all these will not constitute constraints on the present invention. Without departing from the principles of the present invention, those skilled in this art may make a lot of transformations and improvements, which should be considered as being within the protective scope of the present invention.

What is claimed is:

1. A parasitic PIN device in a BiCMOS process, formed on a P-type silicon substrate, an active region being isolated by shallow trench isolation oxide layers, wherein the parasitic PIN device comprises:

an N-type region, comprising N-type pseudo buried layers formed at the bottom of the shallow trench isolation oxide layers and extending into the active region, the N-type region being picked up by forming contact holes in the shallow trench isolation oxide layers and filling the contact holes with metal;

an I-type region, comprising an N-type collector implantation region formed in the active region, the N-type collector implantation region contacting with the N-type region that extends into the active region;

a P-type region, comprising an intrinsic base epitaxial layer formed on a surface of the active region and an extrinsic base implantation region formed in the intrinsic base epitaxial layer by extrinsic base implantation, the P-type region contacting with the I-type region, wherein the P-type region is picked up by forming a metal contact thereon.

2. The parasitic PIN device in a BiCMOS process as claimed in claim 1, wherein the N-type pseudo buried layers are formed by ion implantation at the bottom of the shallow trench isolation oxide layers, the implantation dose being 1 e14 cm$^{-2}$ ~1 e16 cm$^{-2}$, the implantation energy being less than 30 Kev, the impurities implanted being phosphor, arsenic or antimony, the impurity concentration being in a range of 1 e19 cm$^{-3}$ ~1 e21 cm$^{-3}$.

3. The parasitic PIN device in a BiCMOS process as claimed in claim 1, wherein the intrinsic base epitaxial layer of the P-type region is a P-doped silicon epitaxial layer, or a P-doped Silicon-Germanium epitaxial layer, or a P-doped Carbon-Silicon-Germanium epitaxial layer, which is formed by in-situ P-doping and extrinsic base region ion implantation, the impurity concentration of the P-doping being in a range of 1 e19 cm$^{-3}$ ~1 e21 cm$^{-3}$, the impurities implanted during the extrinsic base region ion implantation being boron or fluoride boron, the implantation dose being 1 e14 cm$^{-2}$ ~1 e15 cm$^{-2}$, the implantation energy being 2 KeV~30 KeV.

4. The parasitic PIN device in a BiCMOS process as claimed in claim 1, wherein the impurities implanted in the collector implantation region of the 1-type region are phosphor or arsenic, the implantation dose being 1 e12 cm$^{-2}$ ~5 e13 cm$^{-2}$, the implantation energy being 100 KeV~2000 KeV.

5. The parasitic PIN device in the BiCMOS process as claimed in claim 1, wherein the N-type pseudo buried layers are in contact with each other.

6. A manufacturing method of parasitic PIN device in a BiCMOS process, comprising the following steps:

step 1: forming shallow trenches in a P-type silicon substrate by shallow trench etch process and isolating an active region by the shallow trenches;

step 2: forming N-type pseudo buried layers by N-type pseudo buried layer ion implantation at the bottom of the shallow trenches, the N-type pseudo buried layers forming an N-type region;

step 3: forming shallow trench isolation oxide layers by tilling silicon oxide into the shallow trenches;

step 4: forming an I-type region by N-type collector implantation in the active region;

step 5: conducting thermal annealing to the silicon substrate, enabling the N-type region to extend vertically and laterally into the active region and contact with the I-type region during the annealing process;

step 6: forming a P-type region by forming an intrinsic base epitaxial layer on a surface of the active region and forming an extrinsic base implantation region by P-type extrinsic base region ion implantation into the intrinsic base epitaxial layer, the P-type region being in contact with the I-type region;

step 7: forming deep-hole contacts in the shallow trench isolation oxide layers on the N-type region to pick up the N-type region, and forming a metal contact on the P-type region to pick up the P-type region.

7. The manufacturing method as claimed in claim 6, wherein the implantation dose of the N-type pseudo buried layer ion implantation in step 2 is 1 e14 cm$^{-2}$ ~1 e16 cm$^{-2}$, the implantation energy is less than 30 Kev, and the impurities implanted are phosphor, arsenic or antimony.

8. The manufacturing method as claimed in claim 6, wherein the impurities implanted by the collector implantation in step 4 are phosphor or arsenic, the implantation dose being 1 e12 cm$^{-2}$ ~5 e13 cm$^{-2}$, the implantation energy being 100 KeV~2000 KeV.

9. The manufacturing method as claimed in claim 6, wherein the intrinsic base epitaxial layer in step 6 is an in-situ P-doped silicon epitaxial layer or Silicon-Germanium epitaxial layer or Carbon-Silicon-Germanium epitaxial layer, the impurities implanted in the extrinsic base implantation region being boron or fluoride boron, the implantation dose being 1 e14 cm$^{-2}$ ~1 e15 cm$^{-2}$, the implantation energy being 2 KeV~30 KeV.

10. The manufacturing method as claimed in claim 6, wherein step 5 further comprises enabling the N-type pseudo buried layers to be in contact with each other during the thermal annealing process.

* * * * *

UNITED STATES PATENT AND TRADEMARK OFFICE
CERTIFICATE OF CORRECTION

PATENT NO. : 8,476,728 B2
APPLICATION NO. : 13/218316
DATED : July 2, 2013
INVENTOR(S) : Qian et al.

Page 1 of 1

It is certified that error appears in the above-identified patent and that said Letters Patent is hereby corrected as shown below:

In the Claims

Column 5, Claim 4, line 39, please delete "1-type" and insert --I-type--.

Column 6, Claim 6, line 9, please delete "tilling" and insert --filling--.

Signed and Sealed this
First Day of October, 2013

Teresa Stanek Rea
*Deputy Director of the United States Patent and Trademark Office*